(12) United States Patent
Chang

(10) Patent No.: US 7,210,340 B2
(45) Date of Patent: May 1, 2007

(54) FRONT-WING CANTILEVER FOR THE CONDUCTIVE PROBE OF ELECTRICAL SCANNING PROBE MICROSCOPES

(75) Inventor: Mao-Nan Chang, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 27 days.

(21) Appl. No.: 11/137,575

(22) Filed: May 26, 2005

(65) Prior Publication Data
    US 2006/0214678 A1    Sep. 28, 2006

(30) Foreign Application Priority Data
    Mar. 22, 2005   (TW) .............. 94108732 A

(51) Int. Cl.
    *G01N 13/16*     (2006.01)
(52) U.S. Cl. ........................................ 73/105
(58) Field of Classification Search .............. 73/105; 250/306
    See application file for complete search history.

(56) References Cited
    U.S. PATENT DOCUMENTS
    5,959,200 A *  9/1999  Chui et al. ................. 73/105

2003/0022470 A1 *  1/2003  Liu et al. ................. 438/496

FOREIGN PATENT DOCUMENTS
    EP           1359593 A  * 11/2003  ................. 73/105

* cited by examiner

*Primary Examiner*—Daniel S. Larkin
    (74) *Attorney, Agent, or Firm*—Rosenberg, Klein & Lee

(57) ABSTRACT

The present invention discloses a front-wing cantilever for the conductive probe of electrical scanning probe microscopes, wherein two symmetrical front wings are installed to extend from two lateral sides of the front end of the cantilever so that those two front wings are positioned on two lateral sides of the conductive tip. The front-wing structure of the cantilever can effectively inhibit the optical perturbation in the electrical scanning probe microscopes and obviously promote the analysis accuracy thereof. The front-wing structure can provide the scanned region with an effective dark field lest the optical absorption appears in the scanned region of semiconductor specimen and inhibit the optical perturbation occurs during the measurement and analysis of the differential capacitance.

5 Claims, 8 Drawing Sheets

FRONT-WING CANTILEVER FOR THE CONDUCTIVE PROBE OF ELECTRICAL SCANNING PROBE MICROSCOPES

BACKGROUND OF THE INVENTION

1. Field of the Invention

The present invention relates to an electrical scanning probe microscope, particularly to a front-wing cantilever for the conductive probe of the electrical scanning probe microscope, which can avoid the optical perturbation.

2. Description of the Related Art

Electrical Scanning Probe Microscopy (ESPM), which is a widely applied technology for surface electrical property analysis, has the characteristics of easy performance and can directly and rapidly provide the nanometric electrical information of material surface, such as the variations of current, resistance, and capacitance, and the information gained thereby has the advantage of high accuracy. Via the conductive probe contacting the surface of a specimen, various applications of Electrical Scanning Probe Microscopy can be evolved, such as Scanning Capacitance Microscopy (SCM), Scanning Spreading Resistance Microscopy (SSRM), and Conductive Atomic Force Microscopy (CAFM).

Herein, Electrical Scanning Probe Microscopy (ESPM) is to be exemplified by the Scanning Capacitance Microscope, which utilizes a phase-lock amplifier to amplify the detected small signal, and wherein a modulation voltage, which is an AC bias with a specific frequency and amplitude, is applied to the specimen surface via a conductive probe, and the frequency of the modulation voltage is feedback to the system's phase-lock amplifier to be a reference frequency. The signal of capacitance variation in the specimen surface, which is induced by the modulation voltage, also has the same specific frequency, and when the signal of capacitance variation is input to the phase-lock amplifier, the phase-lock amplifier can amplify the weak signal with the same specific frequency via the reference frequency. Therefore, the Scanning Capacitance Microscope has a very high sensitivity.

The conventional Scanning Capacitance Microscope generally adopts a conductive probe with a flattened type or a V type cantilever and a red laser as the optical-beam-deflection image-forming architecture of the atomic force microscope in order to synchronically obtain the topographic image and the corresponding differential capacitance image. As shown in FIG. 1, the conventional cantilever structure 10 has: a cantilever holder 12; a cantilever 14, extending out from the cantilever holder 12; and a tip 16, installed below the end of the cantilever 14. The conventional cantilever structure has the following disadvantages:

1. The contrast of a differential capacitance image is inferior. The stray light from the red laser results in optical absorption, which further induces carrier injection. The carrier injection results in less difference between the differential capacitance signals of low and high carrier concentration regions. Thus, the contrast of differential capacitance image becomes small.
2. The measured electrical junction width is smaller than the real one. The photovoltaic effect created by the optical absorption results in that the measured junction width is smaller than the real one. Thus, P-N junction width measured thereby is inaccurate.
3. As the optical perturbation results from the optical absorption of material, the above problems will become more serious for narrow energy gap materials, such as $Si_{1-x}Ge_x$, GaAs, InP, etc.

To solve the aforementioned problems, the present invention proposes a front-wing cantilever for a conductive probe of an electrical scanning probe microscope, which not only can avoid the optical perturbation on the measurement and analysis of electrical signals but also can still analyze the topography of material's surface synchronically.

SUMMARY OF THE INVENTION

The primary objective of the present invention is to provide a front-wing cantilever for a conductive probe of an electrical scanning probe microscope, which can inhibit the optical perturbation in the electrical scanning probe microscope and can obviously promote the analysis accuracy.

Another objective of the present invention is to provide a front-wing cantilever for a conductive probe of an electrical scanning probe microscope, which can solve the perturbation on the electrical signals, which is induced by the laser beam of the topographic image-formation architecture, and which also can still enable the topography of material's surface to be synchronically analyzed.

Yet another objective of the present invention is to provide a front-wing cantilever for a conductive probe of an electrical scanning probe microscope, which utilizes the front wings of cantilever to effectively block the stray light from the laser in order to enable the differential capacitance signal to be enhanced, the image contrast to be promoted, and the P-N junction width to be accurately measured.

To achieve the aforementioned objectives, the front-wing cantilever for the conductive probe of the present invention is installed on a cantilever holder, and the front-wing cantilever comprises a cantilever, and a first end of the cantilever is coupled to the cantilever holder; a tip is installed on the bottom of a second end of the cantilever, and two front wings separately extend out from two lateral sides of the second end of the cantilever; the front wings are exactly positioned on both lateral sides of the conductive tip, and provide an effective dark field for the scanned region, which can effectively inhibit the optical perturbation effect in the electrical scanning probe microscope.

To enable the objectives, technical contents, characteristics, and accomplishments of the present invention to be more easily understood, the embodiments of the present invention are to be described below in detail in cooperation with the attached drawings.

DETAILED DESCRIPTION OF THE INVENTION

Herein, the present invention is to be exemplified by Scanning Capacitance Microscopy (SCM); however, it is not intended to limit the scope of the present invention, and the application of the present invention to other Electrical Scanning Probe Microscopes, such as Scanning Spreading Resistance Microscopy (SSRM) and Conductive Atomic Force Microscopy (CAFM), are to be included within the scope of the present invention. The Scanning Capacitance Microscope primarily applies to the analysis of 2-dimensional distribution of carrier concentration and the measurement of the effective channel length of Metal Oxide Semiconductor (MOS) devices. However, the Scanning Capacitance Microscope is influenced by an optical perturbation, which brings about the increase in P-N junction measurement error and the decrease in image contrast. Owing to the above problems, when the Scanning Capacitance Microscope analyzes the carrier concentration distribution and the junction image within a nanometric area, the result will lack accuracy and reliability. Therefore, this embodiment of the present invention proposes a front-wing cantilever for a conductive probe for Scanning Capacitance Microscope, which can enable the optical perturbation to be inhibited, so that the image contrast can be enhanced, measurement error can be reduced, and the carrier distribution microanalysis can be accurately performed by the present invention's low-optical perturbation technology of differential capacitance analysis.

Figure 2:
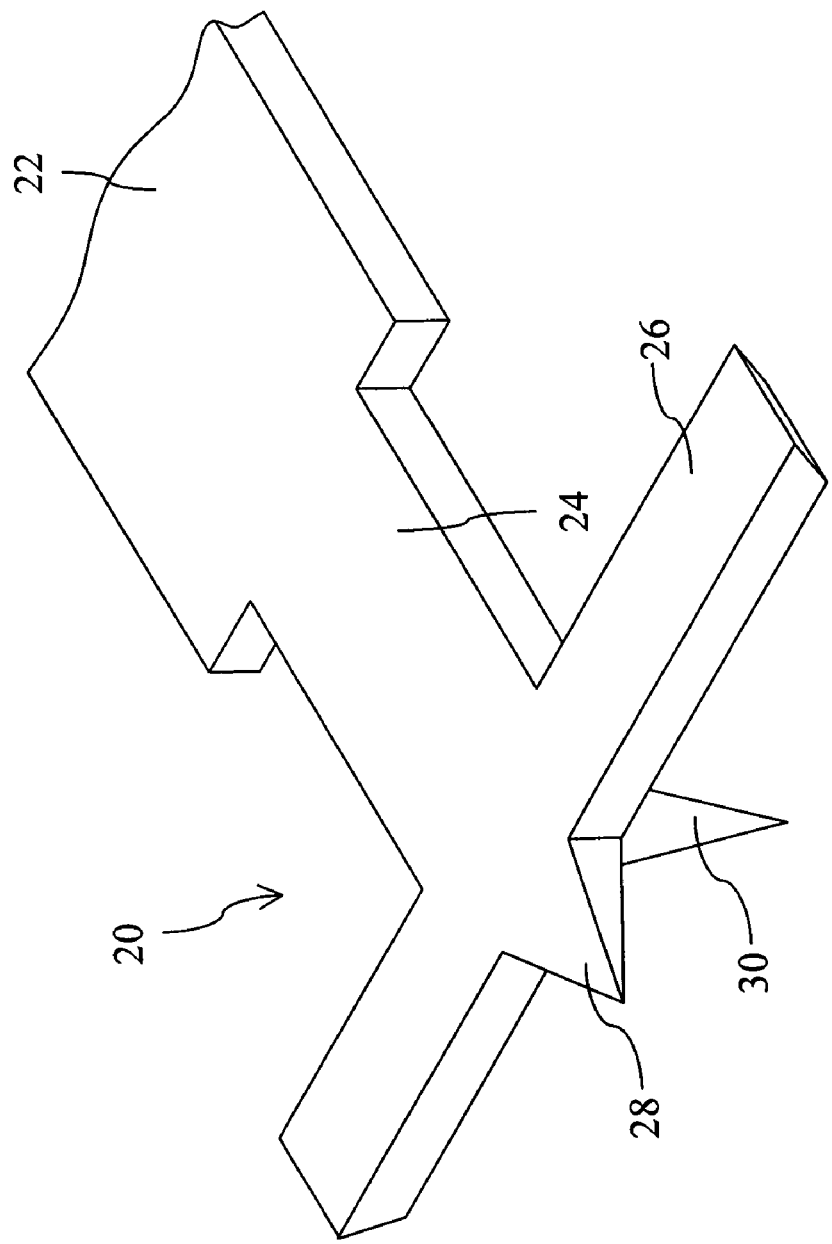
FIG. 2 is a schematic structure diagram of the front-wing cantilever for conductive probe according to one embodiment of the present invention.

Referring to FIG. 2 a schematic structure diagram of the front-wing cantilever for conductive probe of the present invention, the front-wing cantilever 20 for the conductive probe is installed on a cantilever holder 22, and the cantilever holder 22 is fixed to a probe seat of a scanning capacitance microscope (not shown in the drawing). The front-wing cantilever structure 20 comprises a cantilever 24, and two front wings 26 on two lateral sides of the cantilever 24, wherein the cantilever 24 and the front wings 26 can be formed into a unitary body during fabrication. The cantilever 24 has a first end and a second end, and the first end of the cantilever 24 is coupled to the cantilever holder 22, and the second end of the cantilever 24 has a sharpened-point structure 28. A conductive tip 30 projects downward from the bottom of the second end; the conductive tip 30 and the front-wing cantilever 20 can also be formed into a unitary body during fabrication. Two symmetric front wings 26 separately extend out from two lateral sides of the second end of the cantilever 24; the front wings 26 are separately positioned on both lateral sides of the conductive tip 30 and provide an effective dark field for the scanned region.

Figure 3A:
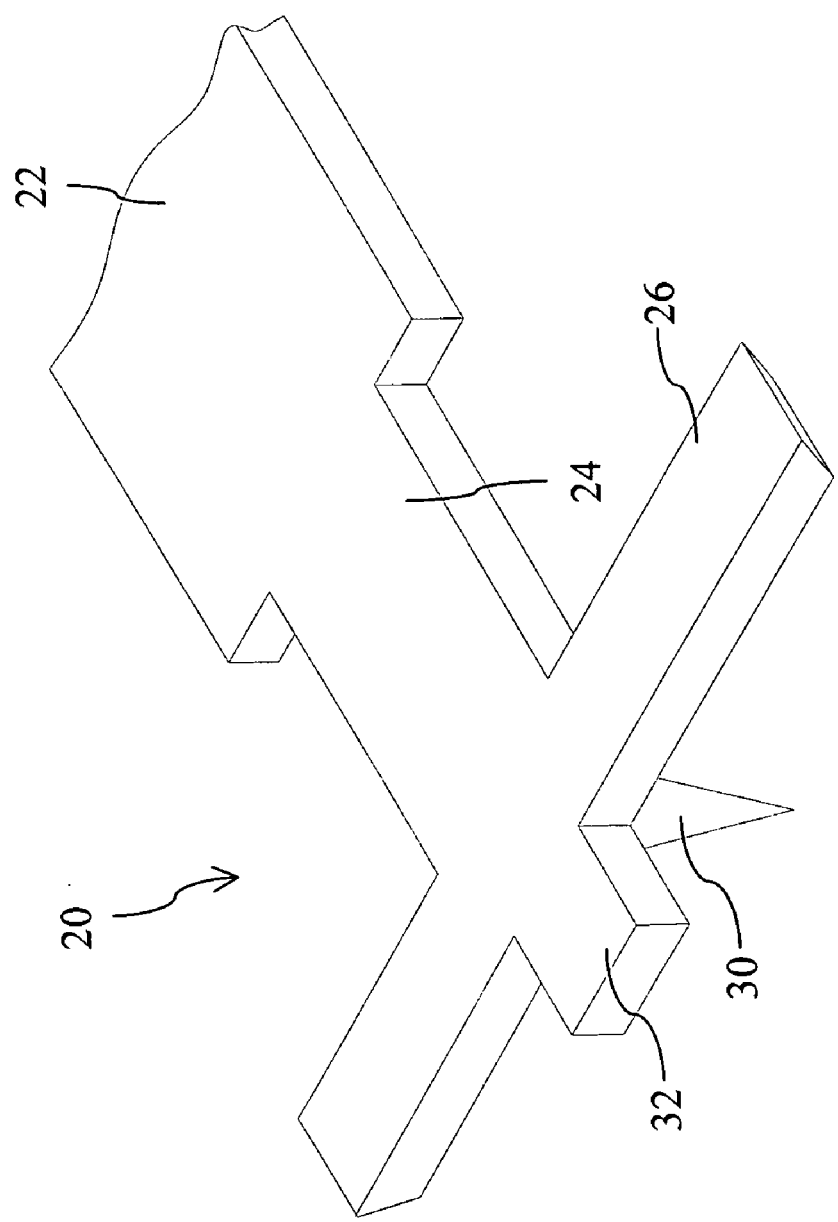
FIG. 3A is a schematic structure diagram of the front-wing cantilever for conductive probe according to anther embodiment of the present invention.
Figure 3B:
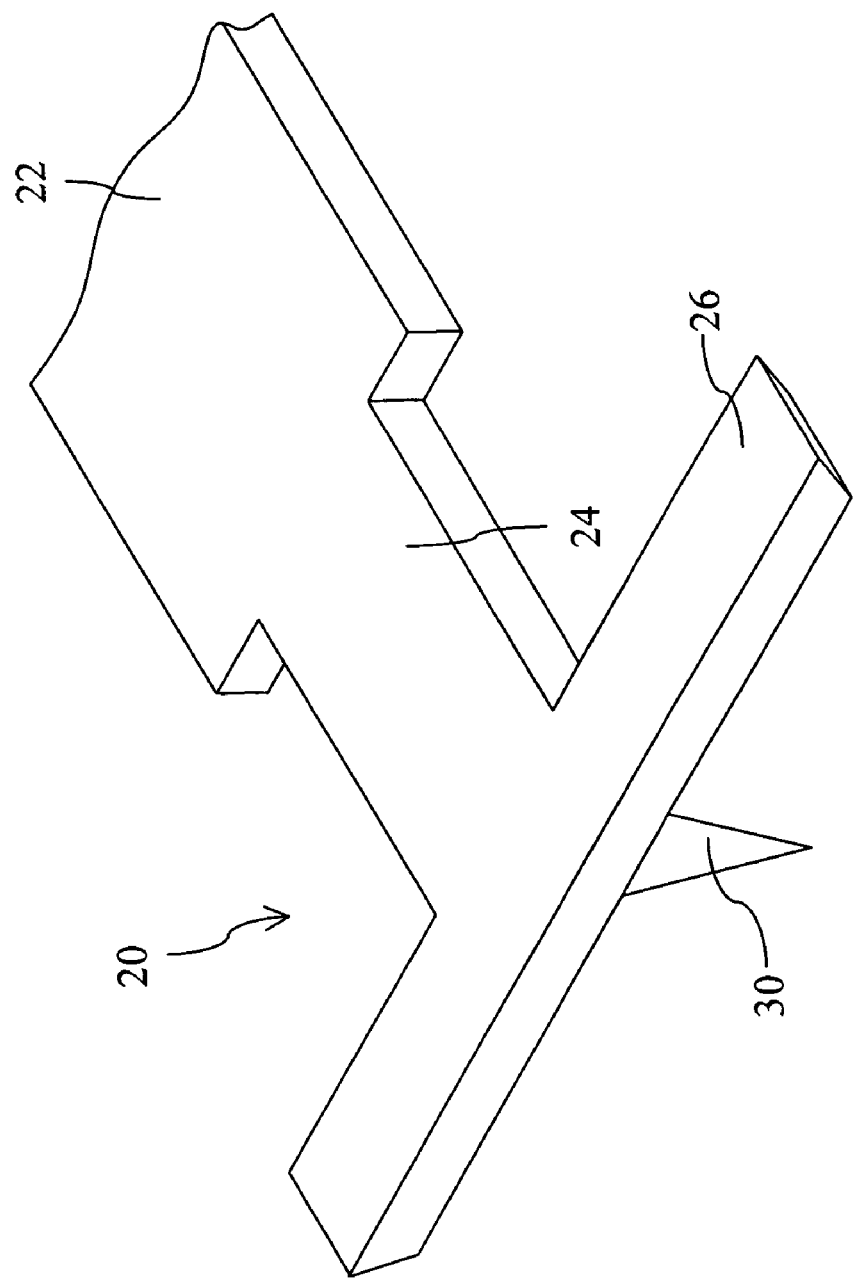
FIG. 3B is a schematic structure diagram of the front-wing cantilever for conductive probe according to yet anther embodiment of the present invention.

In addition to the sharpened-point structure 28 shown in FIG. 2, the second end of the cantilever 24 can also be a flattened structure 32, as shown in FIG. 3A, or be other salient structures, wherein two front wings 26 can also provide an effective dark field for the scanned region of the scanning capacitance microscope. As shown in FIG. 3B, the second end of the cantilever 24 can also be free of the sharpened-point structure 28 or the flattened structure 32, i.e. the second end of the cantilever 24 and the front sides of the front wings 26 are together flattened into a straight line, wherein two front wings 26 can also provide an effective dark field for the scanned region of the scanning capacitance microscope.

Figure 1:
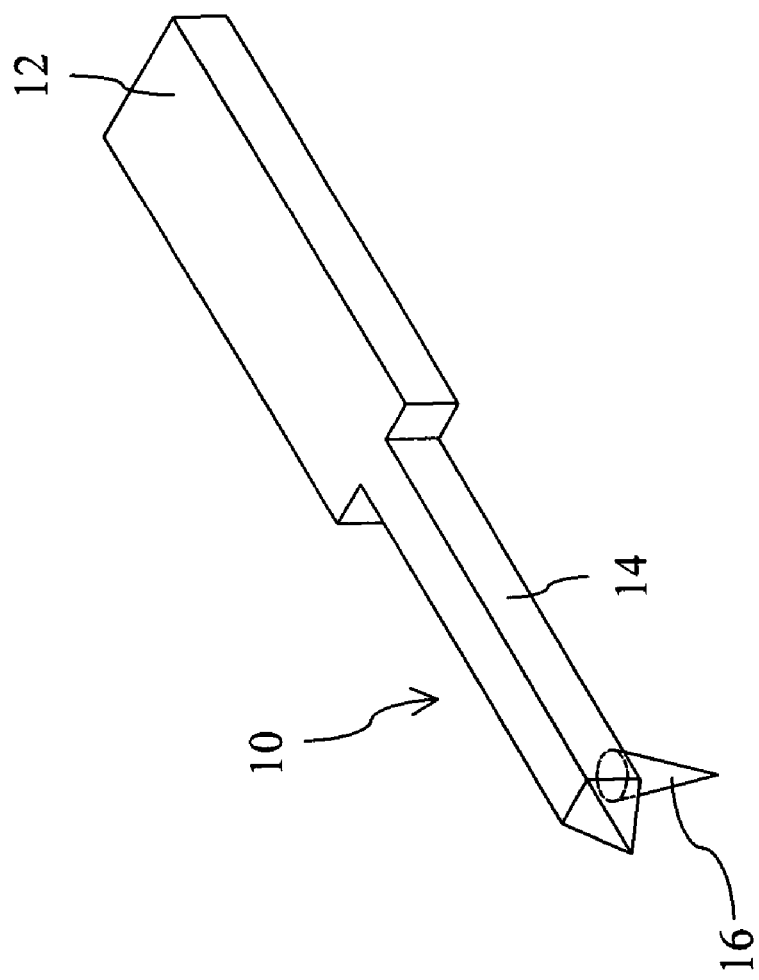
FIG. 1 is a schematic structure diagram of a conventional cantilever structure.

The front-wing cantilever structure 20 of the present invention shown in FIG. 2 and the conventional cantilever shown in FIG. 1 are to be verified below in order to prove that the front-wing cantilever for the conductive probe of the electrical scanning probe microscope of the present invention can effectively block stray light from the laser and can be free from optical absorption and can obviously enhance the differential capacitance signal.

Figure 5A:
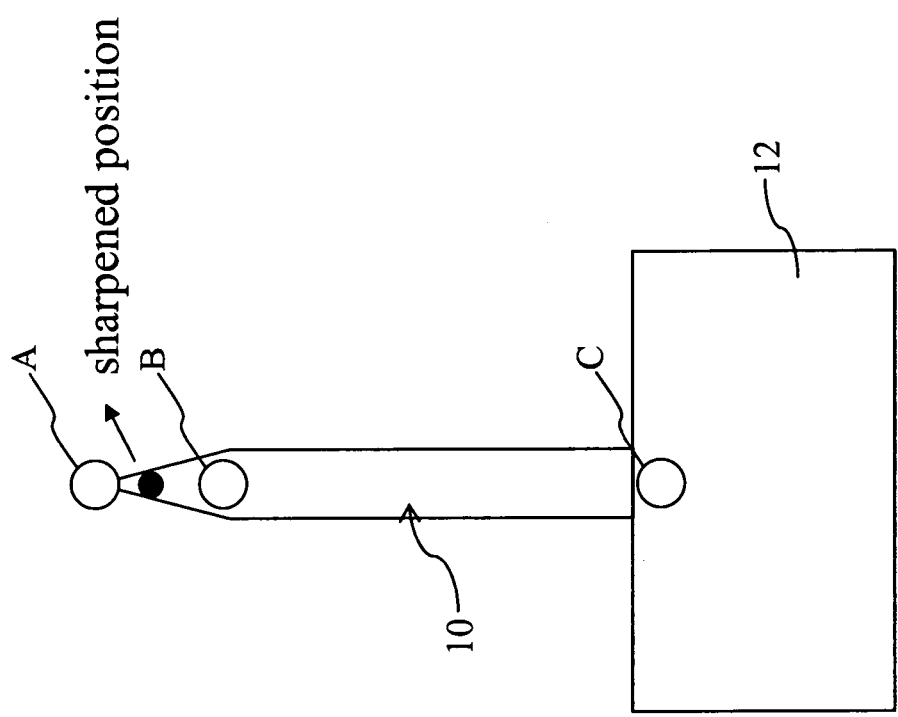
FIG. 5A is a top view of the positions hit by the laser beams during the verification of the conventional cantilever.
Figure 5B:
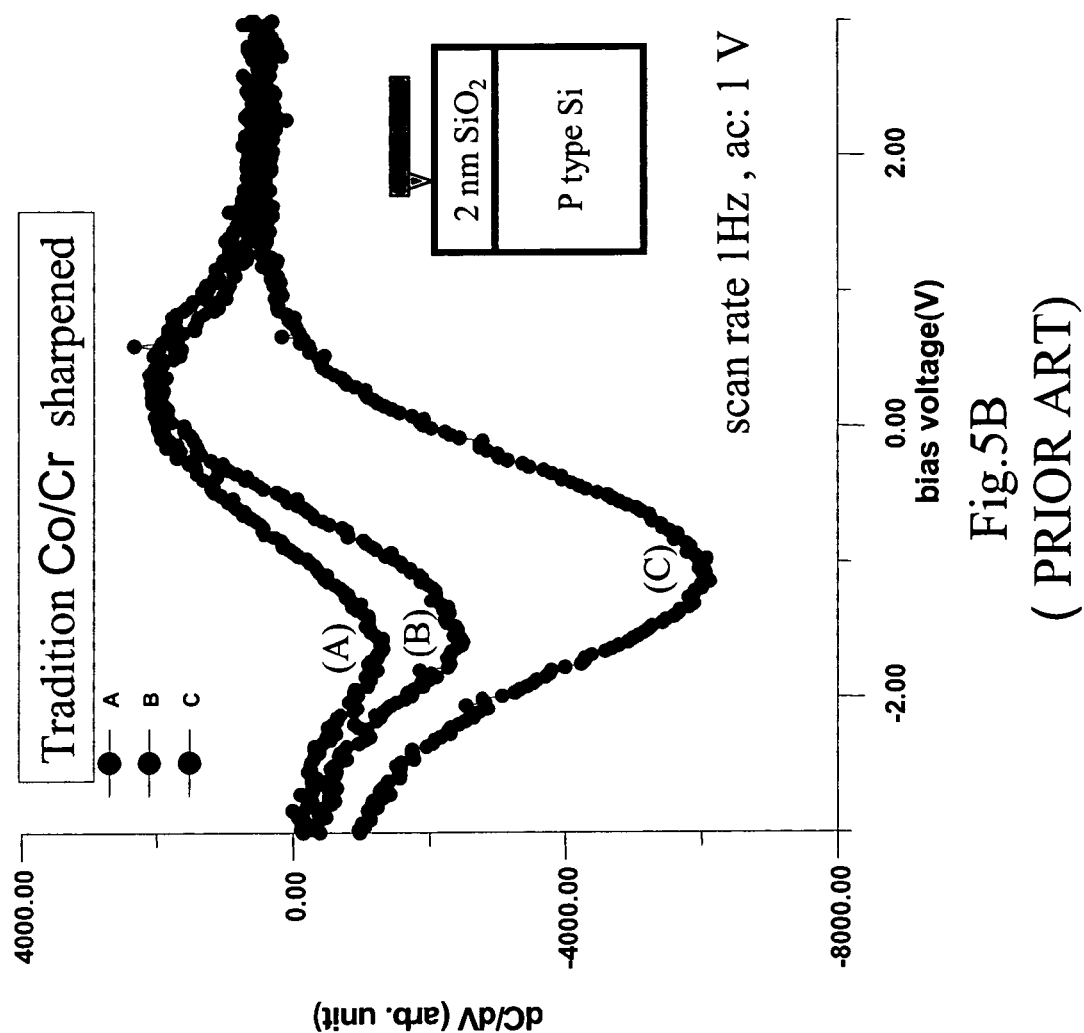
FIG. 5B shows a scanning capacitance spectroscopy (SCS) curves measured in the structure and positions shown in FIG. 5A.

Referring to FIG. 5A and FIG. 5B, the laser beam hits on the positions labeled A and B of the conventional cantilever 10 and the position labeled C of the cantilever holder 12 separately, and the differential capacitance with respect to direct-current bias voltage is measured in each aforementioned positions. As shown in FIG. 5B, as there is no optical perturbation in position C, the measurement result is normal, and as there is the influence from stray light from the laser, the measured differential capacitance is lowered in the depletion regime and contrarily raised in the inversion region.

Figure 4A:
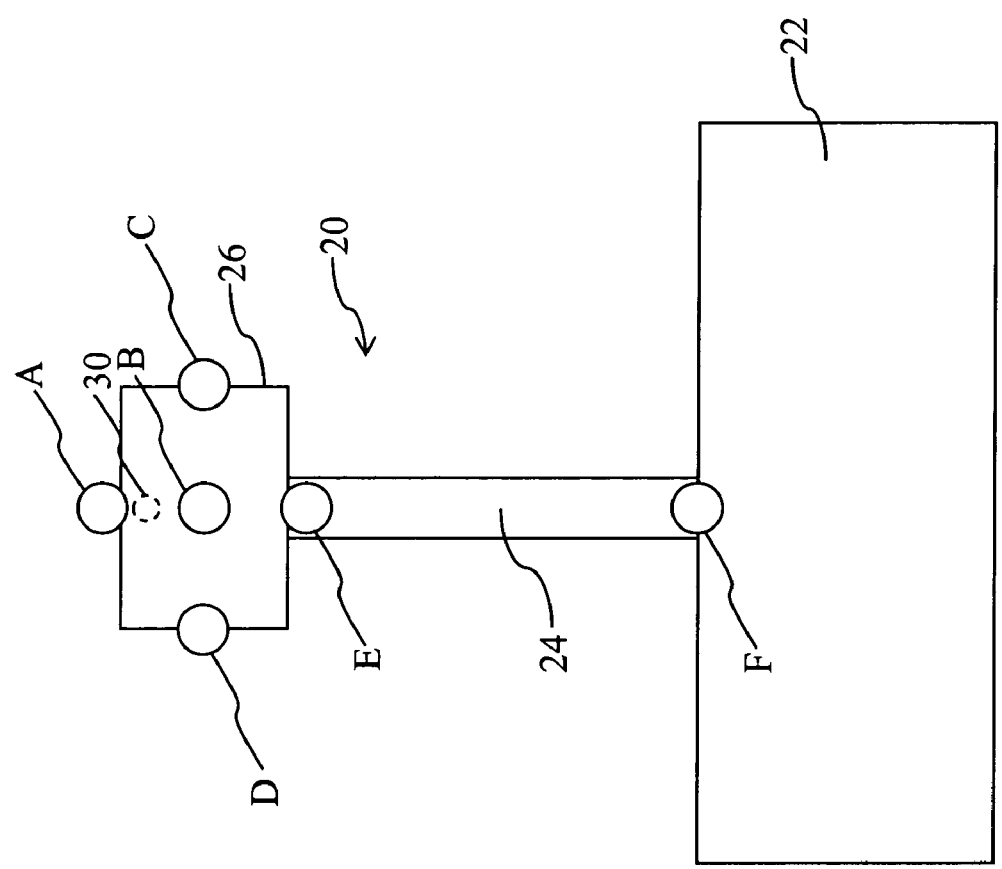
FIG. 4A is a top view of the positions hit by the laser beams during the verification of the present invention.
Figure 4B:
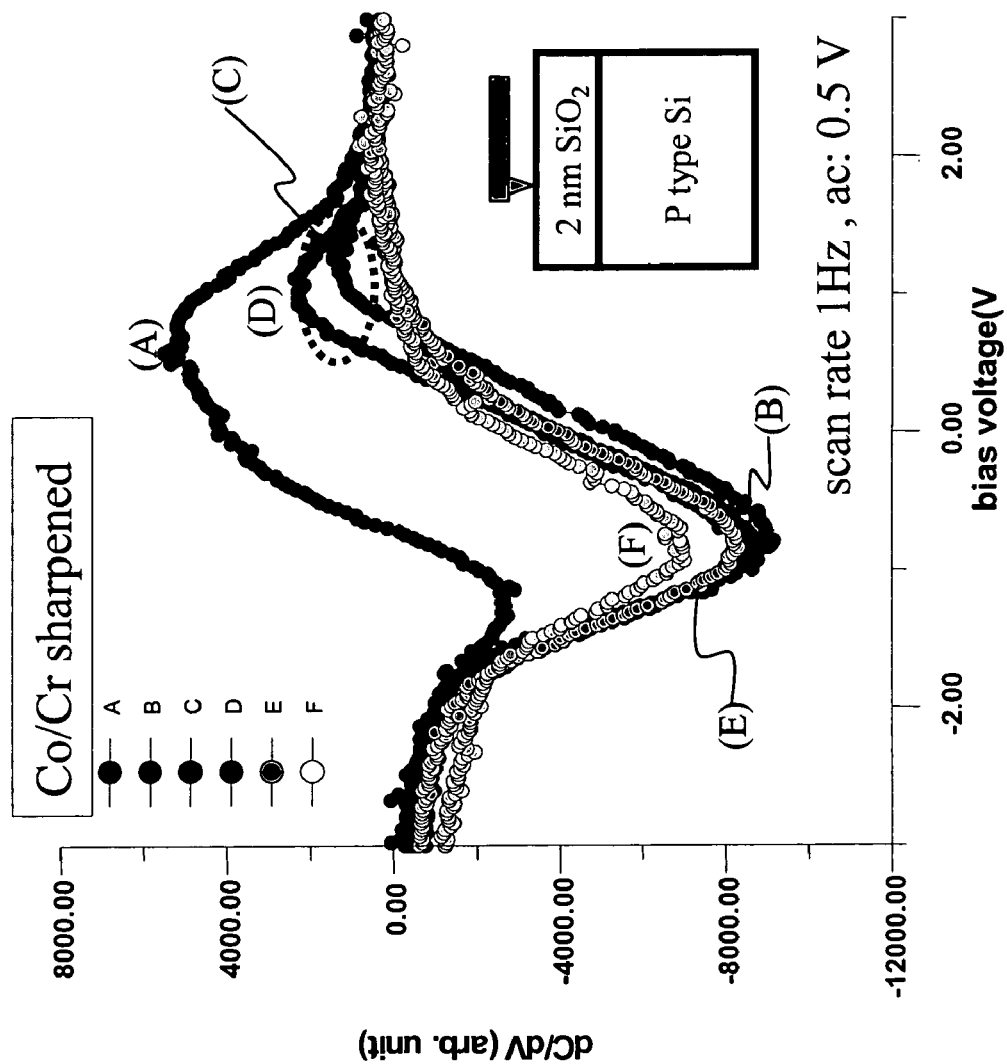
FIG. 4B shows a scanning capacitance spectroscopy (SCS) curves measured in the structure and positions shown in FIG. 4A.

Referring to FIG. 4A and FIG. 4B, the laser beam hits on the positions labeled A, B, C, D, and E of the front-wing cantilever 20 of the present invention and the position labeled F of the cantilever holder 22 separately, and the differential capacitance with respect to direct-current bias voltage is measured in each aforementioned positions. As shown in FIG. 4B, the measurement result in position B is somewhat better than that in position F, which means that there is no influence from stray light at all in position B, i.e. the front wings 26 can effectively block stray light from the laser, and superior signals can be obtained in position B.

Accordingly, the front-wing cantilever for the conductive probe of the present invention can effectively block stray light from the laser, diminish the optical absorption, and enhance the differential capacitance signal, which enables the P-N junction width to be accurately measured. For narrow energy gap materials, such as $Si_{1-x}Ge_x$, GaAs, InP, etc., the present invention can thoroughly solve the optical perturbation on the differential capacitance signal induced by the laser beam of the surface topographic image-forming architecture, and the topographic analysis of material's surface can still be performed synchronically.

The embodiments described above are only to clarify the technical thoughts and characteristics of the present invention and to enable the persons skilled in the art to understand, make, and use the present invention, but not intended to limit the scope of the present invention. Any equivalent modification and variation according to the spirit of the present invention is to be included within the scope of the present invention.

What is claimed is:

1. A front-wing cantilever structure for a conductive probe of an electrical scanning probe microscope, which is coupled to a cantilever holder and comprises:

a cantilever having a first end coupled to said cantilever holder;

a tip is positioned on a bottom of an opposing second end of said cantilever at a widest portion thereof; and two front wings, symmetrically coupled to two lateral sides adjacent said second opposing end of said cantilever to enable said two front wings to be positioned on two lateral sides of said probe, wherein a voidless planar surface is formed on an upper surface of said cantilever and said two front wings.

2. The front-wing cantilever for a conductive probe of an electrical scanning probe microscope according to claim 1, wherein said cantilever and said two front wings are formed into a unitary body during fabrication.

3. The front-wing cantilever for a conductive probe of an electrical scanning probe microscope according to claim 1, wherein said tip, said cantilever and said two front wings are formed into a unitary body during fabrication.

4. The front-wing cantilever for a conductive probe of an electrical scanning probe microscope according to claim 1, wherein said second end of said cantilever is a salient structure.

5. The front-wing cantilever for a conductive probe of an electrical scanning probe microscope according to claim 4, wherein said salient structure is a sharpened-point structure or a flattened structure.

* * * * *